(12) United States Patent
De Natale

(10) Patent No.: US 6,587,613 B2
(45) Date of Patent: Jul. 1, 2003

(54) HYBRID MEMS FABRICATION METHOD AND NEW OPTICAL MEMS DEVICE

(75) Inventor: Jeffrey F. De Natale, Thousand Oaks, CA (US)

(73) Assignee: Innovative Technology Licensing, LLC, Thousand Oaks, CA (US)

( * ) Notice: Subject to any disclaimer, the term of this patent is extended or adjusted under 35 U.S.C. 154(b) by 28 days.

(21) Appl. No.: 09/911,818

(22) Filed: Jul. 24, 2001

(65) Prior Publication Data

US 2003/0021523 A1 Jan. 30, 2003

(51) Int. Cl.[7] ............................. G02B 6/26; H01L 21/00
(52) U.S. Cl. .............................. 385/18; 385/16; 385/17; 438/31
(58) Field of Search ............................. 438/31; 385/16, 385/17, 18

(56) References Cited

U.S. PATENT DOCUMENTS 6,210,988 B1 * 4/2001 Howe et al. .................. 438/50

OTHER PUBLICATIONS

Miniaturized systems with Micro–Optics and MEMS, Invited Paper, SPIE vol. 3878, University of Colorado, Boulder, Comicromirror Arrays Fabricated by Flip–Chip Assembly, Michalicek et al., Sep. 1999, p. 68–79.
Designing Microelectromechanical Systems–on–a Chip in a 5–level Surface Micromachine Technology, M. Steven Rodgers et al., Sandia National Laboratories, Intelligent Micromachine Department, http://www.mdl.sandia.gov/Micromachine.
DLP, Texas Instruments Digital Imaging Group, Digital Light Processing and MEMS: Timely Convergence for a Bright Future, Hornbeck, Oct. 1995.
SPIE vol. 2639, Advanced Silicon Etching Using High Density Plasmas, Bhardwaj et al. p. 224–233.
Solid–State Sensor and Actuator Workshop, Jun. 1998, Etching Characteristics and Profile Control in a Time Multiplexed Inductively Coupled Plasma Etcher, Ayon et al. EECS, p. 41–44.

(List continued on next page.)

Primary Examiner—Jordan M. Schwartz
Assistant Examiner—Tim Thompson
(74) Attorney, Agent, or Firm—Koppel, Jacobs, Patrick & Heybl

(57) ABSTRACT

A new hybrid method of fabricating optical micro electro mechanical system (MEMS) devices is disclosed that uses both bulk and surface micromachining techniques, and a new optical MEMS device is also disclosed that is fabricated using the new method. The method includes the step of mounting a handle layer to one or more layers of MEMS structural material. Layers of structural and sacrificial material are then built up on the MEMS structural material using surface micromachining techniques. Drive electronics are mounted to the layers of structural and sacrificial material. The handle layer is removed to reveal the MEMS structural layer and the sacrificial material within the various layers is dissolved. The new method is particularly applicable to fabricating optical MEMS devices, with the handle layer being adjacent to a Si mirror layer. The surface micomachining layers form electrode and spring structures. Drive electronics are then mounted on the layers of structural material, so that a bias can be applied to the MEMS structures. The handle layer is removed from the mirror layer to reveal the mirror's reflective surface, and the sacrificial material is dissolved away, freeing the MEMS structures to operate. For optical or other MEMS arrays, a linking framework can be included to attach the MEMS devices.

29 Claims, 7 Drawing Sheets

OTHER PUBLICATIONS

Solid–State Sensor and Actuator Workshop, Jun. 1998, 5–level Polysilicon Surface Micromachine Technology Application to Complex Mechanical Systems, Rodgers et al. p. 144–149.

Solid–State Sensor and Actuator Workshop, Jun. 1998, MEMS Deformable Mirrors for Adaptive Optics, Bifano, et al. p. 71–74.

* cited by examiner

HYBRID MEMS FABRICATION METHOD AND NEW OPTICAL MEMS DEVICE

BACKGROUND OF THE INVENTION

1. Field of the Invention

This invention relates to micro electro mechanical system (MEMS) devices, and more particularly to hybrid method for fabricating MEMS devices and an optical MEMS device fabricated using the new method.

2. Description of the Related Art

There has been a great deal of recent interest in the development of optical MEMS devices for applications such as projection devices, displays, fiber switches, sensors, beam steering and optical data storage devices. Often these optical MEMS devices are fabricated in array configurations with each of the array elements having a micro-mirror that is individually controllable to reflect light in different directions.

One common process for manufacturing MEMS devices is by bulk micromachining using deep etch processing, which is considered a subtractive fabrication technique because it involves etching away material from a single substrate layer to form the MEMS structure. One of the more common substrate materials is silicon (Si), which provides a good reflective surface for optical MEMS devices. The substrate layer can be relatively thick, on the order of tens of microns, and the sophistication of this process allows for the micromachining of different structures in the substrate such as cantilevers, bridges, trenches, cavities, nozzles and membranes. MEMS devices fabricated using this process are considered to be more robust compared to devices from other processes and they are less subject to the surface tension and forces that act upon MEMS devices during processing. However, because only one layer of material is used, the complexity of the MEMS device is typically limited. Details for this process are discussed in J. K. Bhardwaj, H. J. Ashraf, *Advanced Silicon Etching Using High Density Plasmas,* Proc. SPIE, vol. 2639, Pg. 224 (1996 SPIE, Bellingham, Wash.), and A. A. Aryon et al. *Etching Characteristics and Profile Control in a Time Multiplexed Inductively Coupled Plasma Etcher,* Solid State Sensor and Actuator Workshop, pg. 41 (June 1998, Hilton Head, S.C.)

The most common method of fabricating MEMS devices is by surface micromachining techniques. It is considered an additive process because alternate structural layers and sacrificial spacer layers are "built-up" to construct the MEMS structure with the necessary mechanical and electrical characteristics. Polycrystalline silicon (polysilicon) is the most commonly used structural material and silicon dioxide (oxide) glass is the most commonly used sacrificial material. In traditional micromachining processes, these layers are formed in polysilicon/oxide pairs on a silicon substrate isolated with a layer of silicon nitride. The layers are patterned using photolithography technology to form intricate structures such as motors, gears, mirrors, and beams. As the layers are built up, cuts are made through the oxide layers and filled with polysilicon to anchor the upper structural layers to the substrate or to the underlying structural layer. After the build-up process, the sacrificial (oxide) layers are removed using various techniques such as hydrofluoric acid release etching, which frees the device to move relative to the substrate. [M. A. Michalicek, J. H. Comtois, and H. K. Schriner, *Design and Fabrication of Optical MEMS Using a Four-level,* Planarized, Surface Micromachined Polysilicon *Process,* Proc. SPIE Vol. 3276, pp. 48–55 (1998)].

MEMS devices fabricated using this process can be more complex than bulk micromachined devices, with the complexity of the devices determined by the number of polysilicon/oxide layer pairs. A single pair limits designers to simple sensors. Geared mechanisms require two pairs wherein the polysilicon layer from the first pair is used to form the gears and the polysilicon layer from the second pair used to form the locking hub. Motorized mechanisms require a minimum of three independent layer pairs. More recently, a 5-level surface micromachining technology has been developed, which allows for the fabrication of complex movable components on translatable stages that can engage and interact with other subassemblies. This technology is commonly referred to as the Sandia Ultra-planar Multi-level MEMS Technology V (SUMMiT V). [M. S. Rogers and J. J. Sniegowski, *Designing Microelctromechanical Systems-On-A*Chip in a 5-level Surface Micromachine Technology, $2^{nd}$ Annual Int. Conf. on Engineering Design and Automation (August 1998), and M. S. Rogers and J. J. Sniegowski, *5-Level Polysilicon Surface Micromachining Technology Application to Complex Mechanical Systems,* Proc. 1998 Solid State Sensor and Actuator Workshop, pg. 144 (June 1998, Hilton Head, S.C.)]

One disadvantage of the use of the surface micromachining process for micro-mirror arrays is that the thin polysilicon layers are typically used as the micro-mirrors and they can be extremely sensitive to residual stress. This can cause significant curvature in the micro-mirror, which degrades the optical quality of the individual mirror and of the array. In addition, polysilicon micro-mirrors provide a poor reflective surface and to make them more reflective the mirror surface can be metalized with reflective thin films. However, this can introduce additional film stresses that can cause further micro-mirror curvature. Also, using one of the polysilicon layers for the mirror reduces the number of available structural layers that can be used for actuators, electrodes, springs, etc., reducing the design flexibility and ultimate device complexity.

Finally, the roughness of the polysilicon surface can degrade optical quality. This can be mitigated with surface polishing (as is used in SUMMiT V), or through flip-chip transfer processing. One recently developed optical MEMS device has been fabricated using this flip-chip technique. is [M. A. Michalicek et al., *Micromirror Arrays Fabricated by Flip-Chip Assembly,* SPIE vol. 3878, (Sept. 20, 1999)]. A silicon mirror is anchored to a silicon substrate by an oxide using commercial foundry processes and bonding pads are deposited on it. A ceramic substrate is then patterned with gold wire and indium bonding pads to mate with the mirror pads. The mirror/substrate structure is then flip-chip mounted on the ceramic substrate and the mirror is released from the substrate by dissolving the oxide with a hydroflouric acid etch. The resulting silicon mirror surface is smooth, replicating the original substrate, but the mirror is very thin. If it is coated to make more reflective, the mirror can be stressed and deformed. Also, variations in bonding stresses can impair global micro-mirror array uniformity.

Another type of optical MEMS array has been developed by first fabricating the array's drive electronics and then building micro-mirrors on the electronics. [L. J. Hornbeck, *Digital Light Processing and MEMS: Timely Convergence for a Bright Future,* Plenary Session, SPIE Micromachining and Microfabrication, Vol. 2639, Pg. 2 (October 1995, Austin, Tex.)]. This fabrication process requires low temperatures and is strictly a surface micromachining process This limits the flexibility in changing the process to fabricate different structures for different applications. Also, like the polysilicon micro-mirrors, these micro-mirrors are relatively thin and can be susceptible to deformation under stress. For instance, any coating placed on the mirror to increase its ability to reflect must be very thin or the mirror can deform. Also, by being so thin there is a danger that the mirrors can misregister, degrading the array's performance.

SUMMARY OF THE INVENTION

The present invention provides a new method for fabricating MEMS devices and a new optical MEMS device fabricated using the new method. The new method is a hybrid that combines bulk deep-etch and surface micromachining fabrication techniques to include the advantages of both.

The new hybrid method includes the step of providing a layer of bulk micromachining material and then building up layers of structural and sacrificial material on the bulk micromachining material using surface micromachining techniques. A substrate with drive electronics is then mounted to the layers of structural and sacrificial material. The bulk material is then micromachined and the sacrificial material within the various surface layers is dissolved.

The new method is particularly applicable to fabricating optical MEMS devices, beginning with the step of mounting a handle layer to a mirror layer, to hold and protect the mirror layer. Layers of structural and sacrificial materials are then built on the mirror layer using surface micromachining techniques, with the structural material forming electrode and spring structures. Drive electronics are then mounted on the layers of structural material so that a bias can be applied to the electrode and spring structures The handle layer is removed from the mirror layer to reveal the mirror's reflective surface, and the sacrificial material is dissolved from the surface micromachining layers, freeing the electrode and spring structures to operate.

For optical or other MEMS device arrays, a linking framework can be included to link the individual MEMS elements to one another. In the above method, the linking framework is preferably built-up on the layers of structural and sacrificial material prior to mounting the drive electronics. The linking framework is also built up using the same surface micromachining techniques. The drive electronics are then mounted to the linking framework to provide mechanical and electrical interconnection with the MEMS structure.

The invention also provides a new optical MEMS device fabricated using a hybrid fabrication process including a mirror fabricated using bulk micromachining techniques and a substrate with drive electronics to activate the mirror. The device also includes a spring structure and an electrode fabricated using surface micromachining techniques. The spring structure is connected between the substrate and mirror, holding the mirror above the substrate. The electrode is mounted on the substrate between said mirror and said substrate. A bias applied across the mirror and electrode activates the device, causing the mirror to be drawn toward the electrode against the action of the spring structure.

The new hybrid method and new optical MEMS device provide many advantages over conventional methods and devices. For optical MEMS devices the micro-mirror is formed from the subtractive bulk deep etch process wherein the handle layer is removed from the Si layer. The resulting micro-mirror is thicker and more rugged than those formed from surface micromachining processes and provides a good reflective surface. The device also includes MEMS structures that are built-up using surface micromachining techniques. This allows for the fabrication of more complex MEMS structures compared to purely bulk micromachined devices. By including a linking framework for MEMS arrays, global uniformity can be enhanced.

These and other further features and advantages of the invention will be apparent to those skilled in the art from the following detailed description, taken together with the accompanying drawings, in which:

DETAILED DESCRIPTION OF THE INVENTION

Hybrid Method

Figure 1:
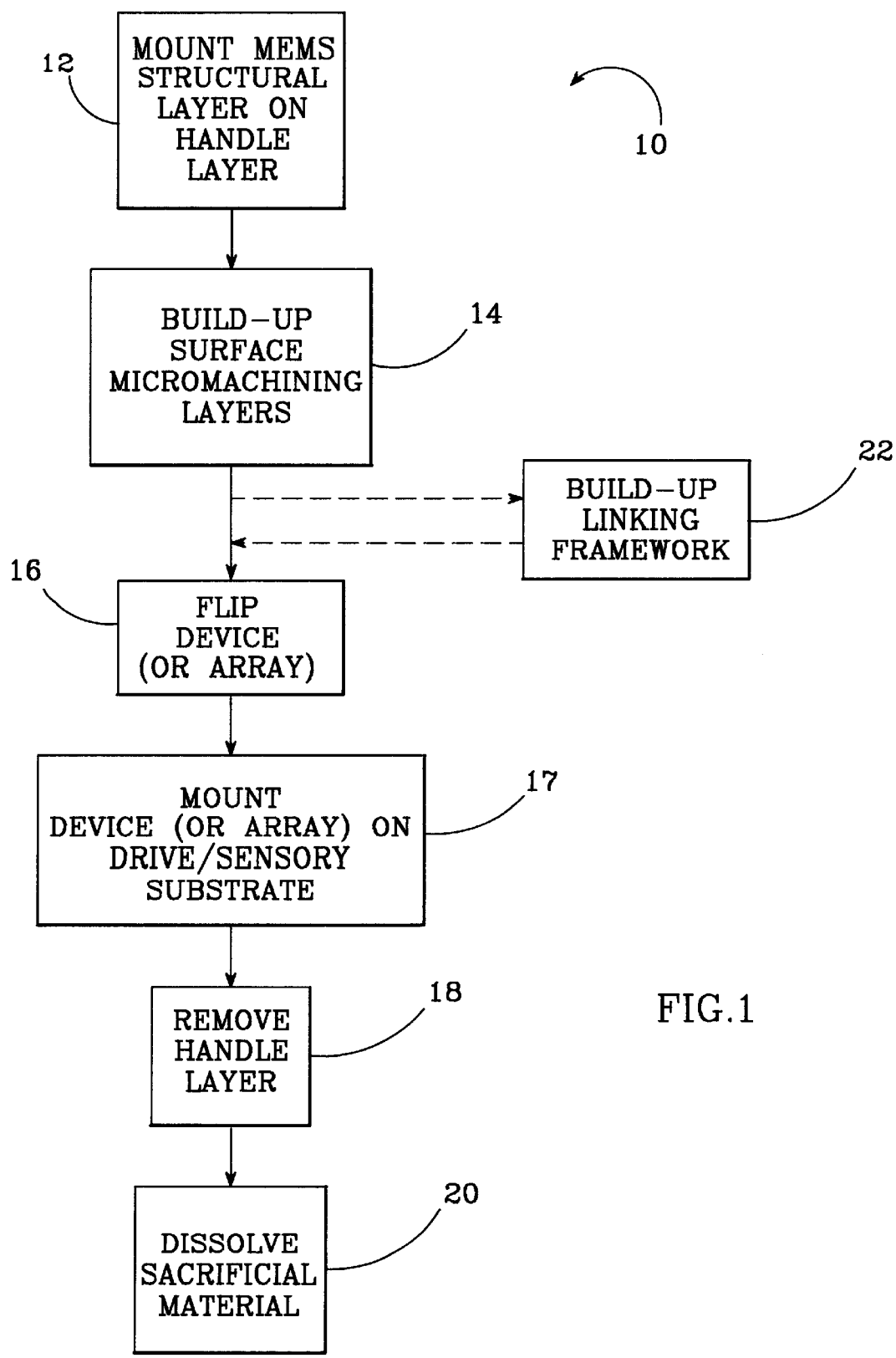
FIG. 1 is a flow diagram for the new hybrid method of fabricating MEMS devices.

FIG. 1 is a flow diagram 10 for the new hybrid method of fabricating MEMS devices in accordance with the present invention to fabricate a single MEMS device or an array of MEMS devices. The following primarily describes a new method for fabricating a single MEMS devise but the method is equally applicable to fabricating an array of MEMS devices.

In the first step 12, a layer of MEMS structural material is mounted to a "handle" layer by a sacrificial mounting layer/material. The handle layer can be made of many different materials and are used to hold and protect the MEMS structural layer while the surface micromachining layers are built upon it (see below). For example, the MEMS structural layer can be a mirror layer for an optical MEMS device. When fabricating an optical MEMS array, numerous mirror layers are used. The handle layer along with the mounting layer/material, hold and protect the surface of the mirror layer during later fabrication steps, and once the handle and oxide layers are removed the reflective surface of the mirror is revealed. In other embodiments more than one handle layer and MEMS structural material can be used for a single MEMS device.

In the next step 14, surface micromachining layers are built-up on the MEMS structural layer using the above-described surface micromachining techniques. Polysilicon/oxide layer pairs are deposited to build-up various MEMS structures. Many different structures can be built-up using this process, including but not limited to sensors, gears, and springs and electrodes for optical MEMS devices, and this step can use the recently developed SUMMiT V 5-layer surface micromachining process described above. Many standard growth processes, such as reaction furnace growth, can be used to build-up the layers and different materials can be used for the layers such as Polycrstalline silicon, silicon dioxide, silicon germanium or silicon carbide.

In the next step 16, the MEMS structure from step 14 is flipped, and in step 17 it is mounted on a substrate having drive and/or sensory electronics or connection to the electronics. Contacts can be included on the MEMS structure or the drive/sensory substrate, either of which provide mechanical and electrical connections between the substrate and the MEMS structure. This allows a bias to be applied to structure or a signal sent from the structure to the substrate.

In the next step 18, the handle layer is removed, revealing the mounting layer/material between the handle layer and the MEMS structural layer. The oxide material can then be chemically etched away, revealing the surface of the MEMS structural layer. Alternatively, the mounting layer/material can be etched first and the handle layer lifted from the MEMS structural layer.

In the final step 20, the sacrificial oxide material in the polysilicon/oxide layer pairs is dissolved. The spaces left by the dissolved oxide material allow the remaining polysilicon MEMS structures to move and also provides mechanical and electrical isolation between the structures. For instance, in optical MEMS devices an electrode can be both electrically and mechanically isolated from spring structures that hold the MEMS micro-mirror. A bias can be applied across the electrode and mirror so that the mirror moves up and down on the spring structure while the electrode remains stationary.

When fabricating MEMS arrays, numerous devices are built-up using steps 12 and 14 and a linking framework is included to link the individual MEMS devices. In step 22 the framework is built up on the spring and drive structure of the individual MEMS devices by surface micromachining techniques, linking them together. The framework also includes structural and sacrificial polysilicon/oxide pairs. In the final step 20, the framework's sacrificial oxide material is dissolved along with the other sacrificial materials in the structure. When the structure is mounted to the sensor/drive electronics in step 16, the framework is arranged between the electronics and the surface micromachining layers. A bias applied to the MEMS devices, or a signal sent to the substrate from the devices, passes through the linking framework.

Hybrid Method for Fabricating Optical MEMS

Figure 2:
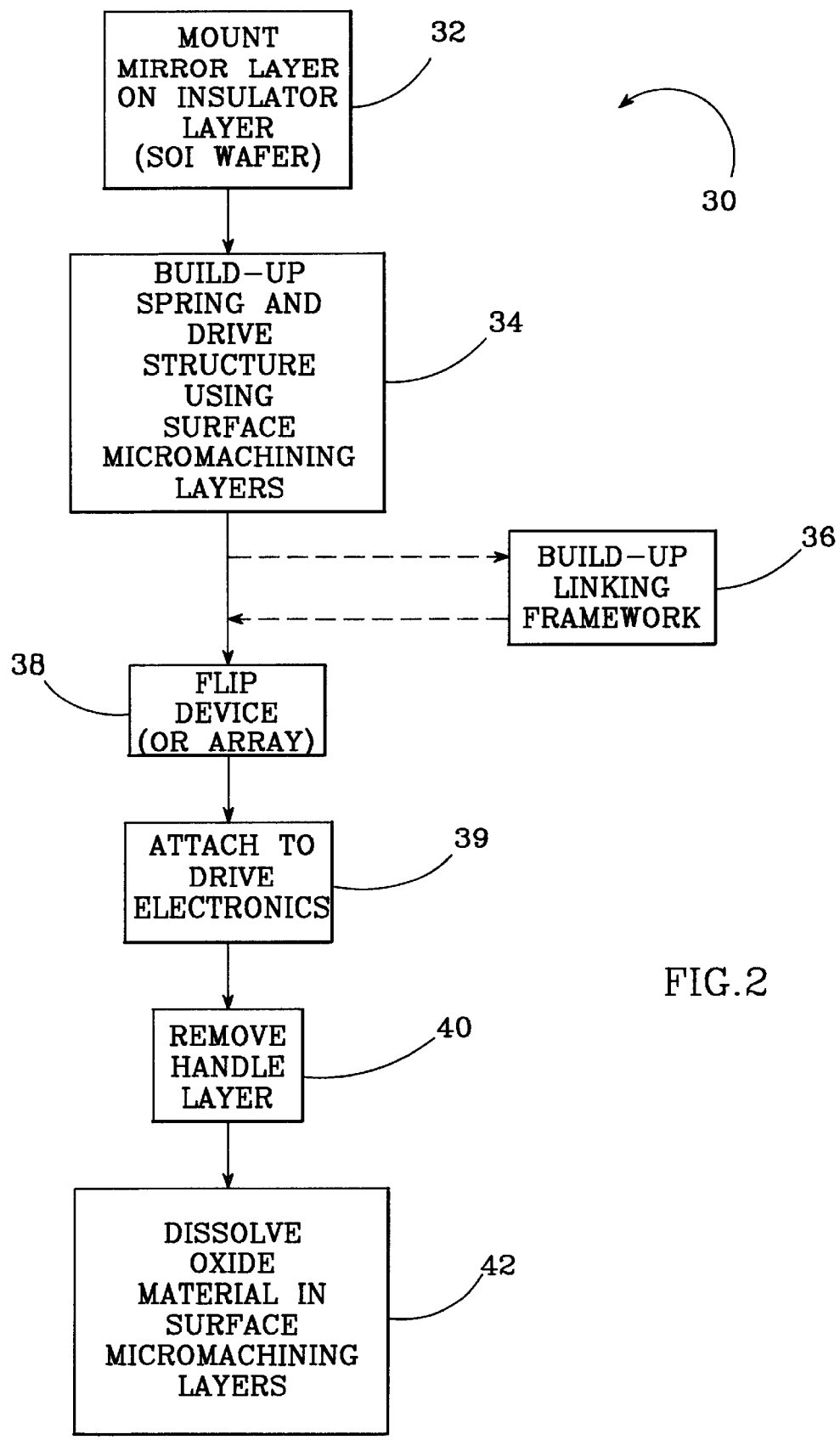
FIG. 2 is a flow diagram for the new hybrid method used to fabricate optical MEMS devices.

FIG. 2 shows a flow diagram 30 for the new hybrid method in accordance with the present invention, used to fabricate an optical MEMS device. As above, the following primarily describes fabrication of an individual MEMS device but it is equally applicable to fabricating optical MEMS arrays.

In step 32, the MEMS structural layer is mounted on an insulator layer. For optical MEMS devices the MEMS layer serves as the devices' micro-mirror and it can be any material that provides a high-quality reflective surface, with the preferred layer being silicon (Si).

For this step, commercially available silicon on insulator (SOI) wafers can be used and are available from many sources such as: BCO Technologies, plc; SEH America, Inc.; and Virginia Semiconductor, Inc. SOI wafers commonly include a thin Si layer and a thicker Si handle layer sandwiching an insulating oxide material. The surface of the thin Si layer adjacent to the oxide material serves as the reflective micro-mirror surface and the thicker Si layer and oxide material serve as a handle layer to hold and protect the Si mirror layer.

In step 34, the spring and drive structures are built on the SOI wafer using the surface micromachining techniques, with the polysilicon/oxide layer pairs being on the surface of the thin Si layer opposite the Si handle layer. The layer pairs form the electrode to activate the mirror and the spring structure that allows the mirror to move when a bias is applied to the MEMS device and to return when the bias is removed.

In optional step 36, the framework to link a number of optical MEMS devices in an array is built on the spring and drive structure using the same surface micromachining techniques. The framework generally uses 1 or 2 polysilicon/oxide layer pairs and provides a rigid linkage between the array of optical MEMS devices so that the MEMS micro-mirrors can be better aligned and less sensitive to bonding stress.

In step 38 the MEMS structure from step 34 (or alternatively step 36) is flipped. Metallic contacts can be deposited on its bottom layer of the structure before or after flipping. In step 39, the structure is mechanically and electrically attached to substrate with drive electronics using flip-chip bonding techniques. One of the easiest and most common methods for attaching is by solder. However, there is a limit to how small the solder pads can be when used for electrical connections. For smaller optical MEMS devices other attachment methods can be used such as Indium columns.

In step 40, the handle (thick Si) layer, which is now the top layer of the structure, is removed. As described above, different removal methods can be used but in this embodiment the layer is mechanically grinded down to the oxide layer below it and then the oxide layer is dissolved using a chemical etch.

In the final step 42, the sacrificial oxide material in the spring and drive structure and the linking framework is dissolved using a method that dissolves the oxide without damaging the polysilicon or silicon materials in the MEMS structure. A suitable method is chemical etching using a hydrofluoric acid etch.

When the etching process is complete, the mirror and its spring structures are free to move and the drive structure is mechanically and electrically isolated from the spring structures. As more fully described below, a bias can be applied across the mirror and drive structure, causing an electrostatic attraction between the two. This causes the mirror to be drawn toward the drive structure, which in turn compresses the spring structures. When the bias is removed the electrostatic force is also removed and the spring structures are free to return the mirror to its neutral position.

Optical MEMS Device Fabricated Using New Method

Figure 3:
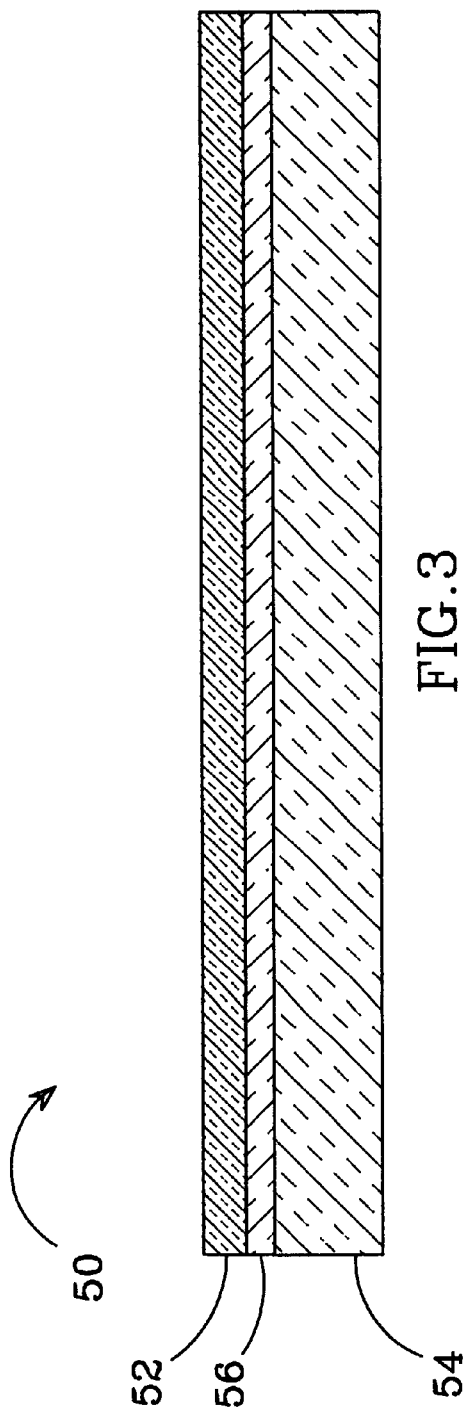
FIG. 3 is a sectional view of a mirror layer on an anchor layer for the new optical MEMS device.

FIGS. 3–9 show a new optical MEMS device fabricated using the new hybrid method described above. FIG. 3 shows a sectional view of SOI wafer 50 provided in accordance with step 32 above. The SOI wafer has a thin Si layer 52 anchored to a handle Si layer 54 by an oxide layer 56. The handle layer 54 is generally thicker than the Si layer 52, with a suitable thickness being approximately 500 microns. The Si layer 52 serves as the MEMS device's micro-mirror and can be less than 10 microns with the preferred range of thicknesses being approximately 5–20 microns, although other thicknesses will also work. If it is too thick, the micro-micro-mirror can have too great a mass to move quickly and if it is too thin, it can loose its rigidity.

Figure 4:
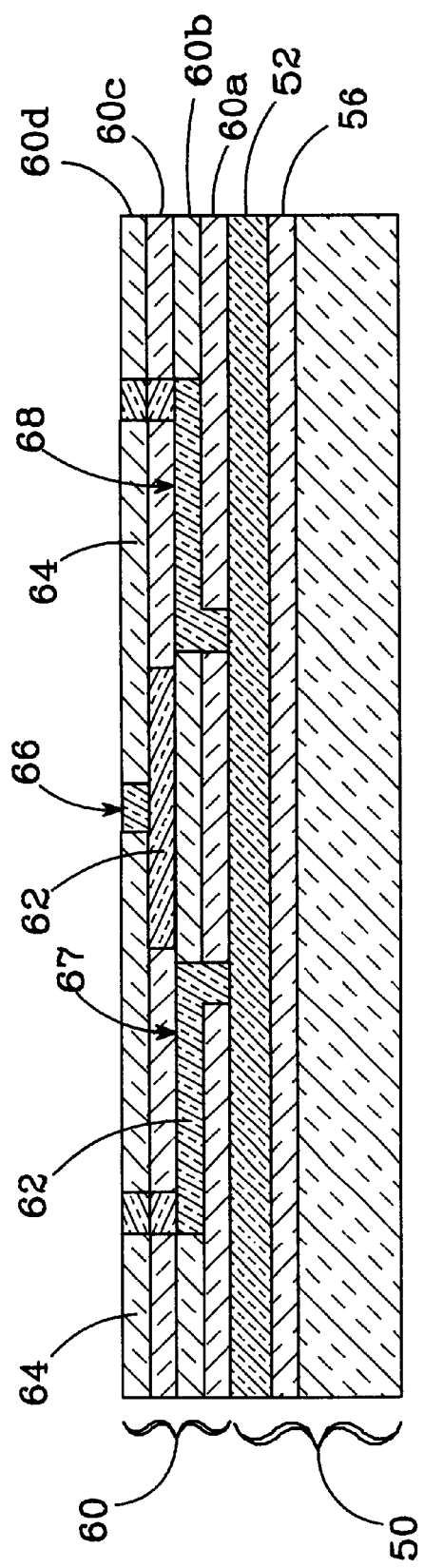
FIG. 4 is a sectional view of the drive and spring structure built up on the mirror layer shown in FIG. 3.

FIG. 4 shows a sectional view of the SOI wafer 50 with the surface micromachining layers 60 built on the surface of the silicon layer 52 opposite the handle layer 56, in accordance with step 34 above. There are four layers 60a–d that correspond to two polysilicon/oxide pairs. Each of the four layers has polysilicon structural material 62 and oxide sacrificial material 64. The four layers are built-up on the silicon layer 52 and the first layer 60a is commonly an oxide layer. It is cut at various locations so that polysilicon can be included to provide a structural connection between the second layer 60b and/or to the Si layer 52. The second layer 60b is commonly a polysilicon layer and during deposition of this layer, polysilicon is introduced into the cut areas of the first layer 60a. The second polysilicon layer can also be cut so that sacrificial oxide can be included when the next layer 60c is deposited. The next layer 60c is an oxide and the final layer 60d is a polysilicon, both of which can also be cut to include material from the adjacent layers.

The layers can be cut during build-up in various ways to construct structures that perform different functions. In layers 60a–d, the polysilicon material 62 forms a drive electrode 66 and spring structures 67 and 68. The layers can have different thicknesses depending on the number of layer pairs used. If the SUMMiT V surface micromachining technique is used to deposit layers 60a–d, the thicknesses of the oxide layers can be in the range of approximately 0.5–2.0 microns and the polysilicon layers can be in the range of approximately 0.3–2.5 microns.

Figure 5:
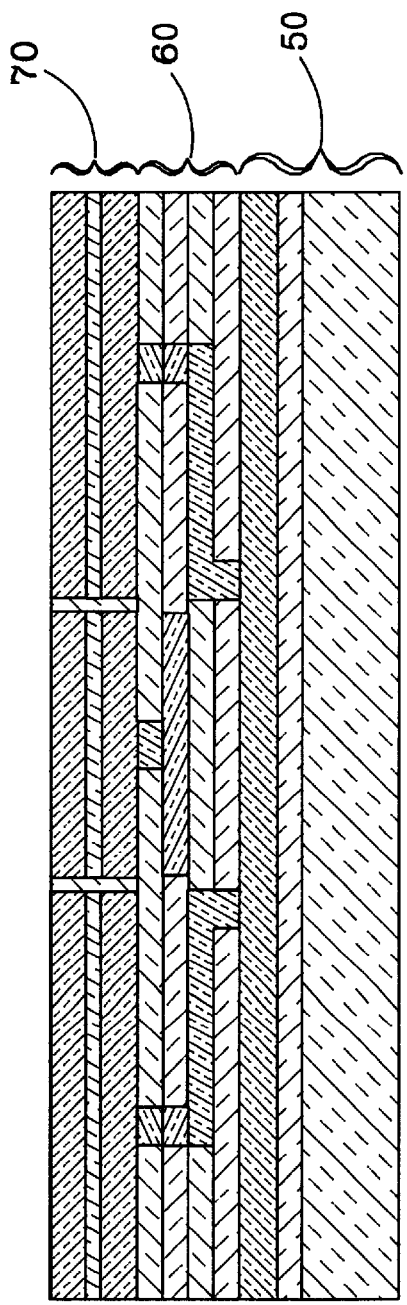
FIG. 5 is a sectional view of the linking framework built up on the structure of FIG. 4.

FIG. 5 shows the structure of FIG. 4 with a framework linking structure 70 built on the spring and drive structure 60, in accordance with step 36 above. The linking framework is a continuous structure across the array of MEMS devices and is built-up on the devices after the spring and drive structures have been built-up on each of the devices. The structure 70 is also fabricated using surface micromachining techniques with 1 or 2 polysilicon/oxide layer pairs. The structure 70 links the individual optical MEMS devices in an array.

The number of layers used for the linking framework 70 directly impacts the number of layers that can be used for the electrode and spring structures 60. By using 2 layer pairs for the linking framework 70, up to three layers can be used for the electrode and spring structure 60. If only 1 layer pair is used, up to four layers can be used for the structure 60. If the optical MEMS device is not to be linked in an array, up to five layer pairs can be used for the spring and drive structures. Another advantage of this structure is that the Si mirror layer 52 can serve as the substrate so that all 5 of the layers can be used for surface micromachining. In conventional 5 layer surface micromachining, the bottom layer commonly serves as the substrate, leaving only 4 layers.

Figure 6:
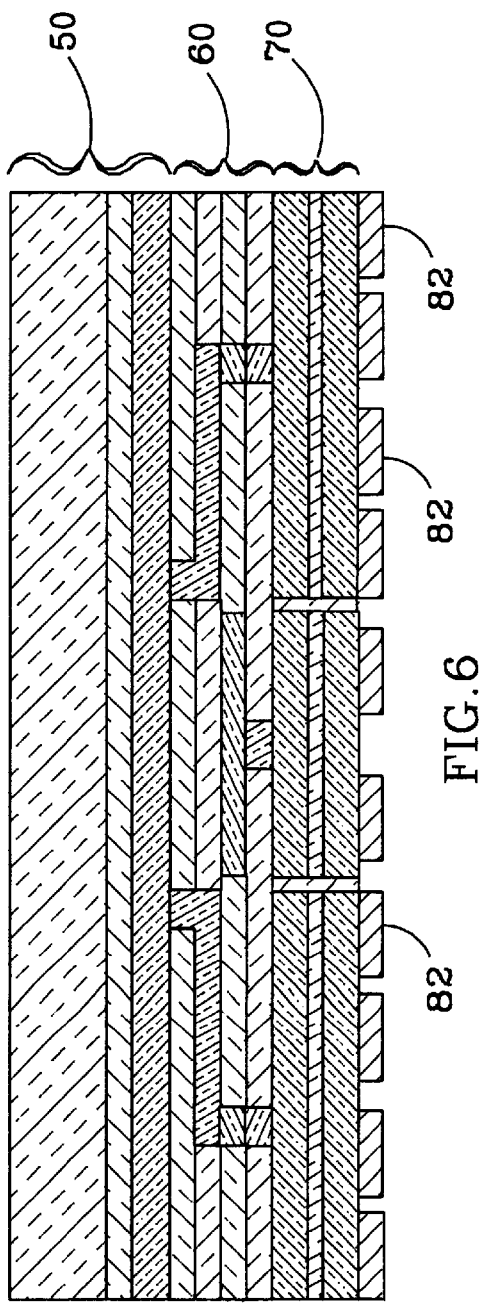
FIG. 6 is a sectional view of the structure in FIG. 5 after flipping for flip-chip mounting.

FIG. 6 shows the structure of FIG. 5 after it is flipped in accordance with step 38 above. Contacts 82 can be deposited on the linking framework structure 70 using known metalization processes, either before or after flipping. If there is no linking framework then the contacts are deposited on the electrode and spring structures.

Figure 7:
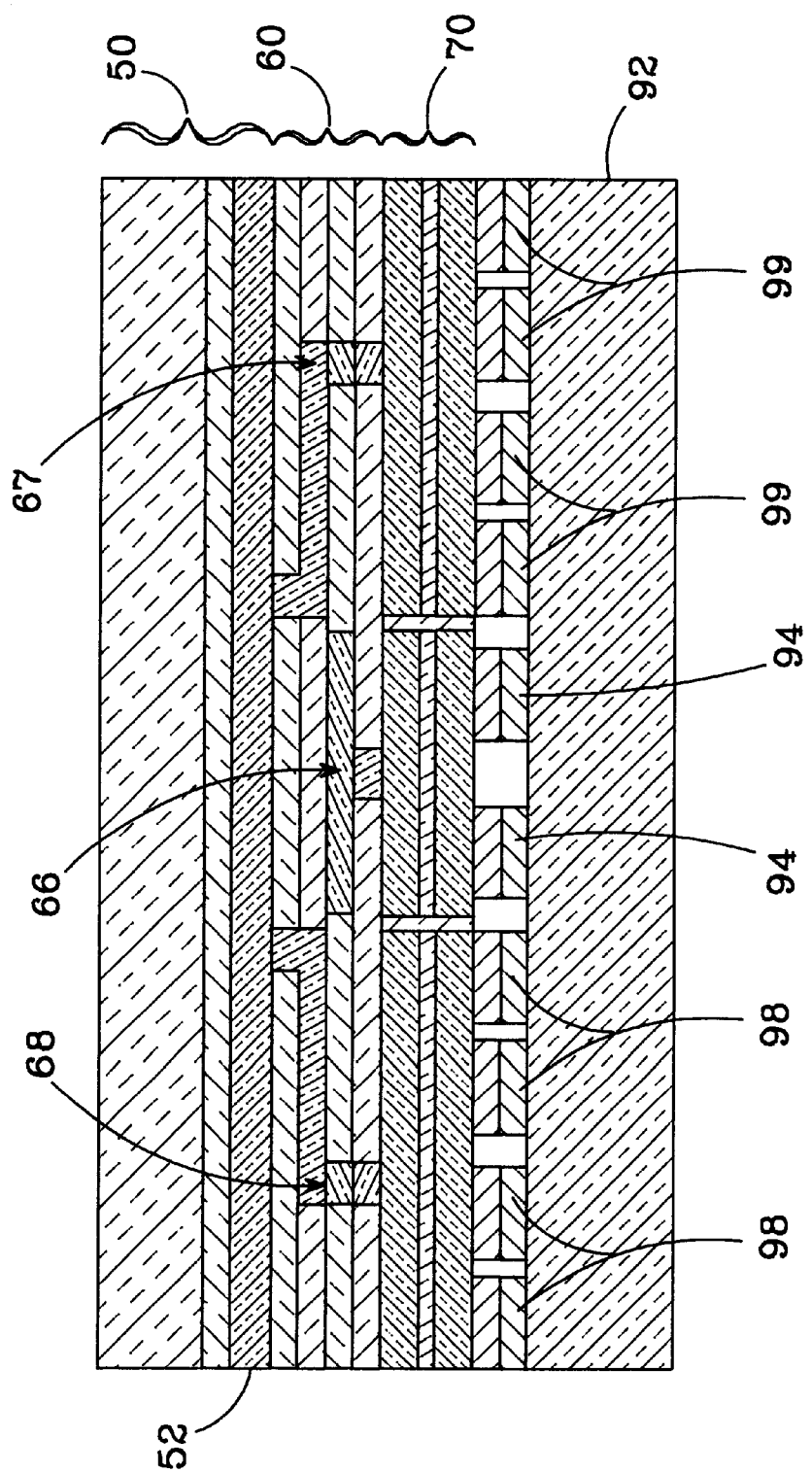
FIG. 7 is a sectional view of the structure in FIG. 6 mounted on a substrate with drive electronics.

FIG. 7 shows the structure of FIG. 6 mounted to a conventional substrate with drive electronics 92. The substrate 92 also has contact pads 94, 98 and 99, which align with the contact pads 82 on the linking framework 70. The aligned contacts provide mechanical and electrical connection between the framework 70 and the substrate 92. During operation, a electrical signal that is applied across contact pads 94 passes to the electrode 66 and an electrical signal applied across contacts 98 and 99 passes to the spring structures 68 and 67 respectively, and on to the micro-mirror layer 52.

The structure in FIG. 7 shows the optical MEMS device after the build-up process is complete. In the steps that follow, various layers are removed or dissolved, exposing the mirror and freeing the MEMS structures to move and operate.

Figures 8, 9:
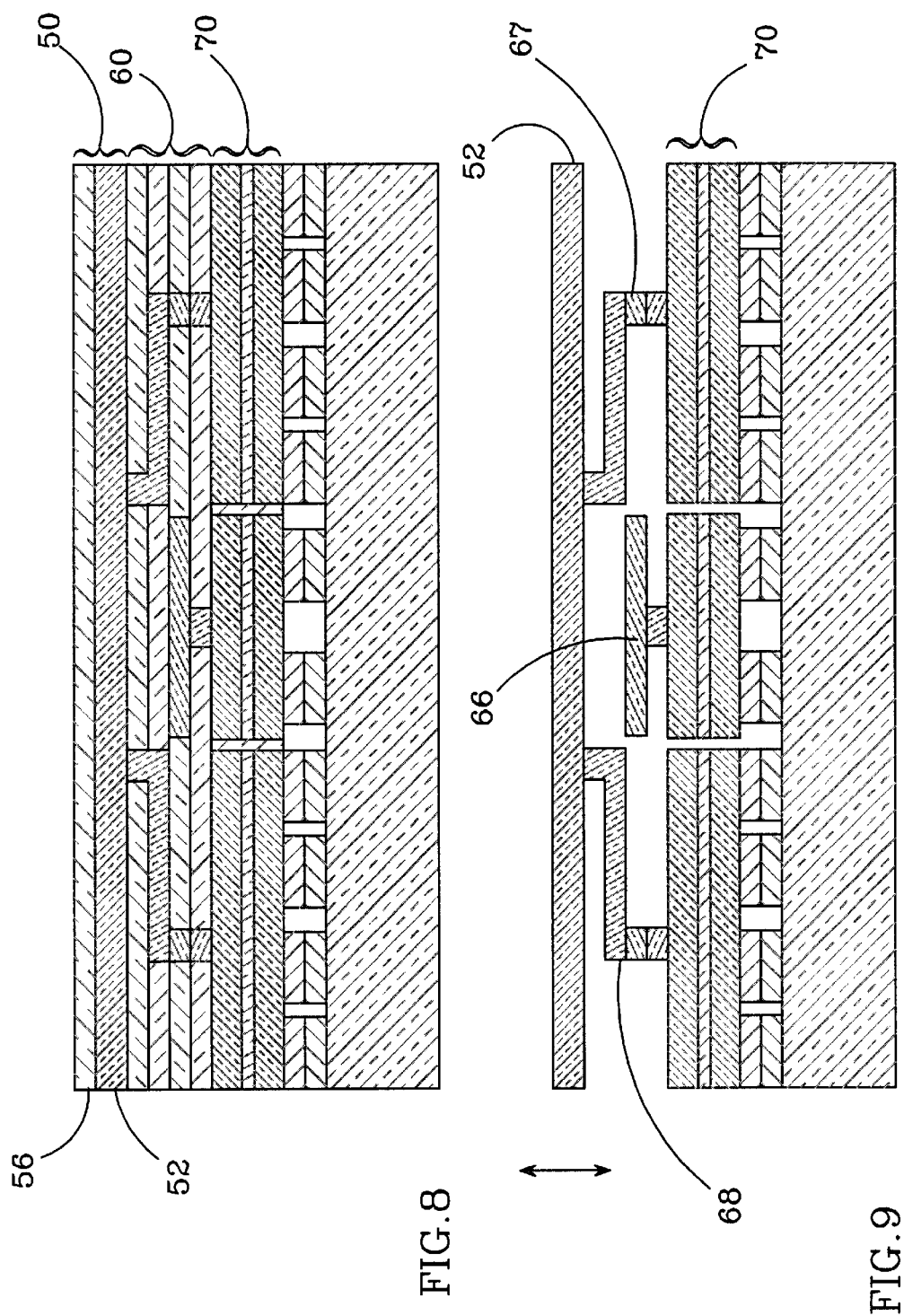
FIG. 8 is a sectional view of the structure in FIG. 7 with the handle layer removed.
FIG. 9 is a sectional view of the structure in FIG. 8 with the sacrificial layers dissolved.

FIG. 8 shows the structure of FIG. 7 with the handle layer 54 removed in accordance with step 39 above, leaving the oxide layer 56 on the Si mirror layer 52. As above, the handle layer is removed by a mechanical method such as grinding. Alternatively, the oxide layer 56 can first be dissolved by chemical etching, thereby releasing the handle layer.

Finally, FIG. 9 shows the structure of FIG. 8 after the remaining oxide sacrificial material has been dissolved by a chemical etch in accordance with step 40 above. This figure further illustrates the resulting new optical MEMS device fabricated using the new method. To create the electrostatic tension, a bias is applied from the substrate 92 across contacts 94 and both or either of contacts 98 and 99. The bias at contacts 98 and/or 99 passes to the micro-mirror 52 and as described above, the bias creates an electrostatic tension between the micro-mirror 52 and the electrode 66. The micro-mirror 52 is drawn down toward the electrode 66, which compresses the spring structures 67 and 68. When the bias is removed, the spring structures 67 and 68 return the mirror 52 to its neutral location.

Figure 10:
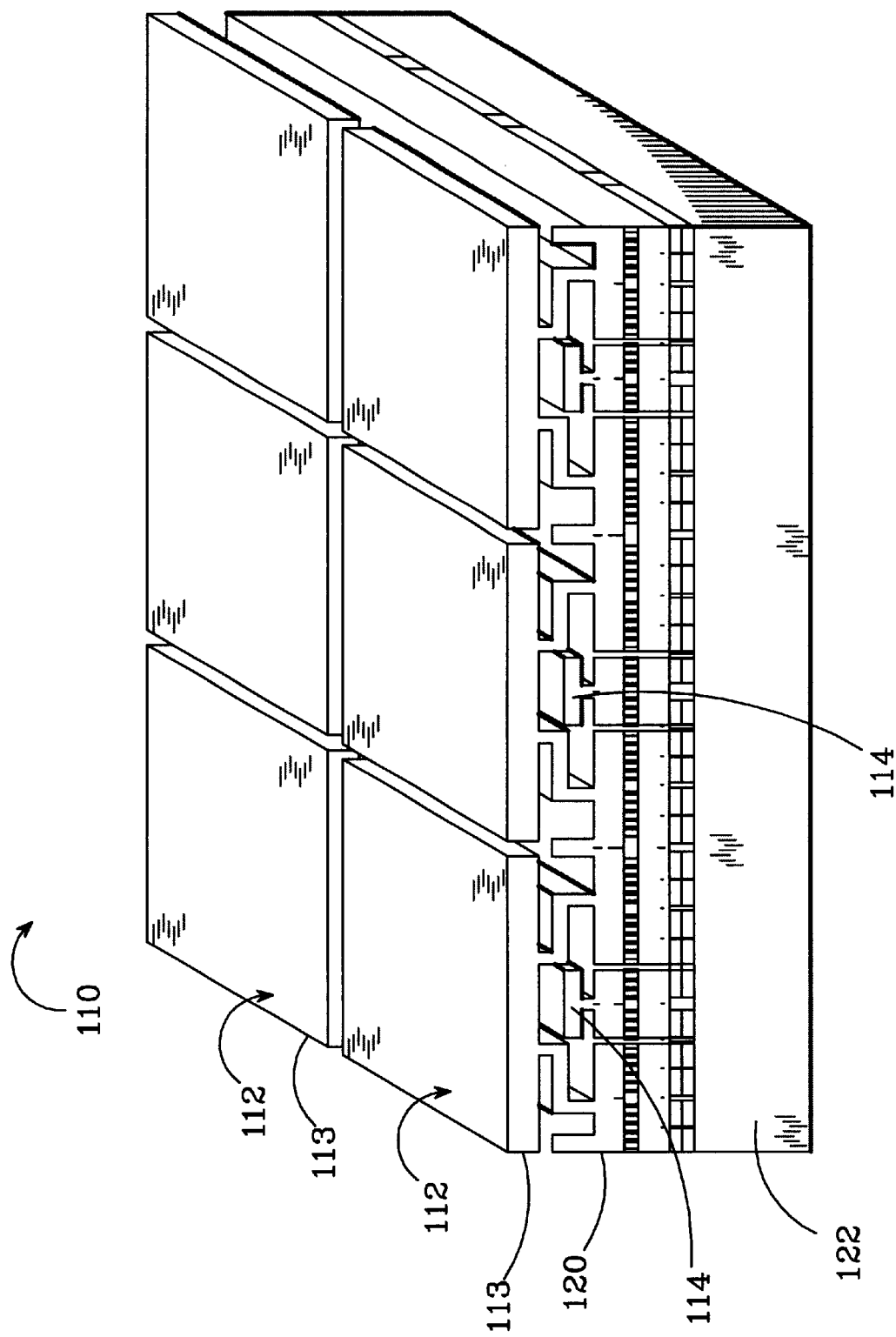
FIG. 10 is a perspective view of an array of optical MEMS devices fabricated using the new hybrid fabrication process.

FIG. 10 shows the new optical MEMS device in the six-element array 110. Each of the MEMS devices 112 has its own micro-mirror 113, electrode 114 and spring structures 116, 118. A single linking framework 120 extends across the array 110, linking the individual MEMS devices to one another. The substrate with drive electronics 122 is mounted to the linking framework 120 so that each of the MEMS devices can be separately actuated by a bias across the electrode 114 and micro-mirror 113 at the particular device 112.

Although the present invention has been described in considerable detail with reference to certain preferred configurations thereof, other versions are possible. For instance, after the handle layer and mounting layer/material are removed, the MEMS structural layer(s) can be further processed using bulk micromachining techniques to form cantilevers, bridges, trenches, cavities, nozzles or membranes in the layer(s). The steps in above methods can occur in a different order and other steps can be included. The above optical MEMS device is one of the many different types that can be fabricated in accordance with this invention, with one example of an alternative device having mirrors that are tipped when actuated. Therefore, the spirit and scope of the appended claims should not be limited to the preferred versions of the invention described in the specification.

I claim:

1. A hybrid method for fabricating micro electro mechanical system (MEMS) devices, comprising:

mounting a handle layer adjacent to a layer of MEMS structural material to protect the surface of said MEMS structural material;

building up layers of device structural and sacrificial material on said layer of MEMS structural material by surface micromachining, said layers of device structural material nd said layer of MEMS structural material forming a MEMS device;

mounting drive electronics to said layers of structural material;

removing said handle layer from said MEMS structural material; and dissolving a away said layers of device sacrificial material to allow aid MEMS device to move under bias from said drive electronics.

2. The method of claim 1, wherein said handle layer is mounted to said layer of MEMS structural material by a sacrificial mounting layer/material.

3. A hybrid method for fabricating micro electro mechanical system (MEMS) devices, comprising:
mounting a handle layer adjacent to a layer of MEMS structural material;
building up layers of structural and sacrificial material on said layer of MEMS structural material by surface micromachining;
mounting drive electronics to said layers of structural and sacrificial material;
removing said handle layer from said MEMS structural material by grinding; and
dissolving away said sacrificial material.

4. The method of claim 2, wherein said handle layer is removed from said MEMS structural material by dissolving said mounting layer/material with a chemical etch, freeing said handle layer.

5. A hybrid method for fabricating micro electro mechanical system (MEMS) devices, comprising:
mounting a handle layer adjacent to a layer of MEMS structural material;
building up layers of structural and sacrificial material on said layer of MEMS structural material by surface micromachining;
mounting drive electronics to said layers of structural and sacrificial material by flip-chip mounting;
removing sad handle layer from said MEMS structural material; and
dissolving away said sacrificial material.

6. The method of claim 1, wherein said sacrificial material is dissolved by chemical etching.

7. The method of claim 1, wherein said MEMS device is in an array of MEMS devices, said method comprising the addition step of building up a linking framework on said structural and sacrificial material of said MEMS devices before the mounting of said drive electronics.

8. A hybrid method of fabricating optical micro electro mechanical system (MEMS) devices, comprising:
mounting a handle layer adjacent to a mirror layer, to hold and protect said mirror layer;
building up layers of structural and sacrificial materials on said mirror layer using surface micromachining, said structural material forming MEMS structures;
mounting drive electronics to said layers of sacrificial and structural material, said drive electronics mounted so that a bias can be applied to said MEMS structures;
removing said handle layer from said mirror layer; and
dissolving away said sacrificial material, freeing said MEMS structures to operate under said bias.

9. The method of claim 8, wherein said mirror layer and handle layer are silicon (Si) that together form a silicon on insulator (SOI) substrate.

10. The method of claim 8, wherein said surface micromachining structural material forms spring structures and an electrode.

11. The method of claim 10, wherein said bias is applied across said mirror and said electrode, said spring structure allowing said mirror layer to move when said bias is applied and return when said bias is removed.

12. The method of claim 10, wherein said spring structure runs between said drive electronics and said mirror to hold said mirror above said drive electronics after said sacrificial material is dissolved.

13. The method of claims 10, wherein said electrode is in electrical connection with said drive electronics and is arranged between said drive electronics and said mirror.

14. The method of claim 11, wherein an electrostatic tension is created between said electrode and said mirror when a bias is applied across the two, said electrostatic tension drawing said mirror toward said drive electronics.

15. The method of claim 8, wherein said handle layer is mounted to said mirror by a sacrificial mounting layer/material.

16. The method of claim 8, wherein said handle layer is removed from said mirror layer by grinding.

17. The method of claim 15, wherein said handle layer is removed from said mirror layer by dissolving said mounting layer/material with a chemical etch, freeing said handle layer.

18. The method of claim 8, wherein said drive electronics are mounted to said layers of structural and sacrificial material by flip-chip mounting.

19. The method of claim 8, wherein said sacrificial material in said layers of structural and sacrificial material is dissolved by chemical etching.

20. The method of claim 8, wherein said optical MEMS device is one of a plurality of MEMS devices in an array, said method comprising the addition step of building up a linking framework on said layers of structural and sacrificial material before said step of mounting said drive electronics, said linking framework arranged between said layers of structural and sacrificial material and said drive electronics.

21. The method of claim 20, wherein said linking framework is formed by building up additional layers of structural and sacrificial materials.

22. An optical micro electro mechanical system (MEMS) device fabricated using a hybrid fabrication process, comprising:
a mirror fabricated using bulk micromachining;
a substrate with drive electronics to activate said mirror; and
a spring structure and an electrode fabricated using surface micromachining techniques, said spring structure connected between said substrate and mirror, and holding said mirror above said substrate, said electrode mounted on said substrate between said mirror and said substrate, a bias across said mirror and said electrode causing said mirror to be drawn toward said electrode.

23. The device of claim 22, further comprising a linking framework between substrate and said spring structure and electrode, said framework connecting said MEMS device to other MEMS devices in an array.

24. An array of optical micro electro mechanical system (MEMS) devices, comprising:
a plurality of optical MEMS devices, each comprising;
mirror fabricated using bulk micromachining;
a spring structure and an electrode fabricated using surface micromachining techniques, said spring structure connected to said mirror;
a linking framework attached to said optical MEMS devices to link them adjacent to one another, each said spring structure and electrode connected to said framework, said electrode between said framework and said mirror; and
a substrate with drive electronics mounted to said linking framework to apply a bias across spring structure and electrode causing said mirror to be drawn toward said electrode.

25. A hybrid method for fabricating micro electro mechanical system (MEMS) devices, comprising:
building up layers of structural and sacrificial material on a layer of bulk micromachining material by surface micromachining, said layers of structural material and said layer of bulk micromachining material forming a MEMS device;

mounting drive electronics to said layers of structural material;

etch micromachining said layer of bulk micromachining material; and dissolving away said sacrificial material to allow said MEMS device to move freely.

26. The method of claim 25, wherein said bulk micromaching material comprises a handle layer mounted to layer of MEMS structural material by a sacrificial mounting layer/material.

27. The method of claim 26, wherein said handle layer is removed from said MEMS structural material by dissolving said mounting layer/material with a chemical etch, freeing said handle layer.

28. The method of claim 25, wherein said sacrificial material is dissolved by chemical etching.

29. The method of claim 25, wherein said MEMS device is in an array of MEMS devices, said method comprising the addition step of building up a linking framework on said structural and sacrificial material of said MEMS devices before the mounting of said drive electronics, said linking framework attaching said MEMS devices.

* * * * *

UNITED STATES PATENT AND TRADEMARK OFFICE
CERTIFICATE OF CORRECTION

PATENT NO.       : 6,587,613 B2                                Page 1 of 1
APPLICATION NO.  : 09/911818
DATED            : July 1, 2003
INVENTOR(S)      : Jeffrey F. DeNatale It is certified that error appears in the above-identified patent and that said Letters Patent is hereby corrected as shown below:

In column 2, line 43, delete the word "is".

In column 3, line 42, replace "built up" with --built-up--.

In column 4, line 47, replace the word "are" with --is--.

Col. 8 in claim 1, line 56, replace "nd" with --and--.

Col. 8 in claim 1, line 62, delete the word "a".

Col. 8 in claim 1, line 63, replace "aid" with --said--

Col. 9 in claim, line 27, replace the word "sad" with --said--.

Signed and Sealed this

Eighth Day of May, 2007

JON W. DUDAS
*Director of the United States Patent and Trademark Office*